US007501705B2

(12) United States Patent
Pascucci

(10) Patent No.: US 7,501,705 B2
(45) Date of Patent: Mar. 10, 2009

(54) CONFIGURATION TERMINAL FOR INTEGRATED DEVICES AND METHOD FOR CONFIGURING AN INTEGRATED DEVICE

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 295 days.

(21) Appl. No.: 11/261,457

(22) Filed: Oct. 27, 2005

(65) Prior Publication Data
US 2006/0103001 A1 May 18, 2006

(30) Foreign Application Priority Data
Oct. 29, 2004 (IT) .......................... MI2004A2073

(51) Int. Cl.
*H01L 23/48* (2006.01)

(52) U.S. Cl. .................. 257/748; 257/734; 257/750; 257/773; 257/780

(58) Field of Classification Search .............. 257/734, 257/748, 750, 773, 774, 780, 781, 784, 786
See application file for complete search history.

(56) References Cited

U.S. PATENT DOCUMENTS

| 6,146,985 A * | 11/2000 | Wollesen ..................... 438/618 |
| 6,424,028 B1 * | 7/2002 | Dickinson ..................... 257/678 |
| 6,569,709 B2 * | 5/2003 | Derderian ..................... 438/109 |
| 6,991,970 B2 * | 1/2006 | Fogal et al. .................. 438/128 |

* cited by examiner

*Primary Examiner*—Zandra Smith
*Assistant Examiner*—Paul E Patton
(74) *Attorney, Agent, or Firm*—Lisa K. Jorgenson; Robert Iannucci; Seed IP Law Group PLLC

(57) ABSTRACT

A configuration terminal for integrated devices includes a first and a second portion structurally independent and connected to respective first and second terminals and it has at least one contact terminal suitable to be selectively connected to such first and second terminals. Also a method configures an integrated device that includes a plurality of address pads and respective supply pins. The method includes: realizing at least one configuration terminal having a first and a second portion structurally independent and connected to at least one contact terminal; providing the contact of such first and second portions with respective terminals; and configuring the device by a short-circuiting of the contact terminal with at least one of said terminals.

30 Claims, 9 Drawing Sheets

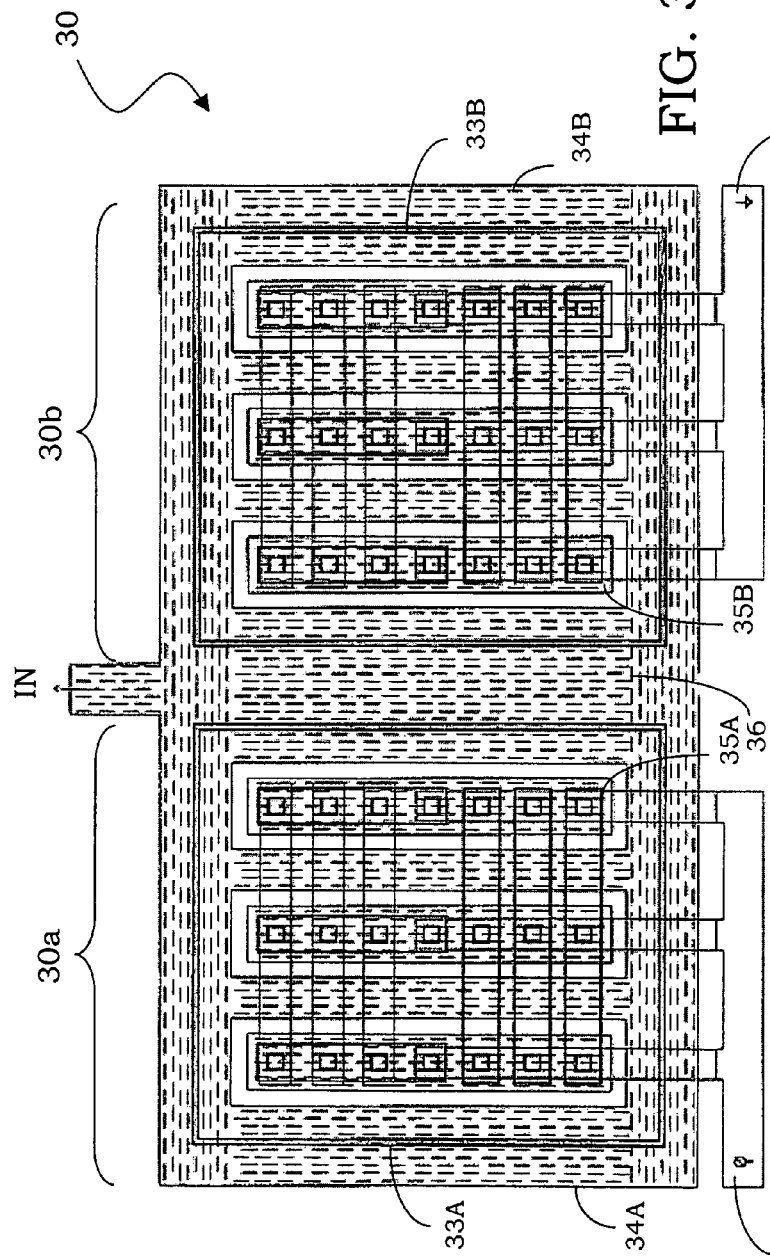
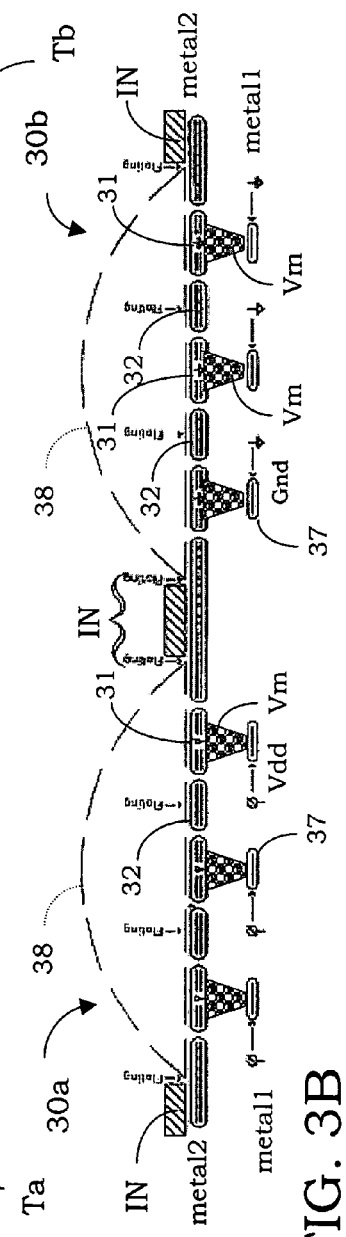
FIG. 3A
FIG. 3B

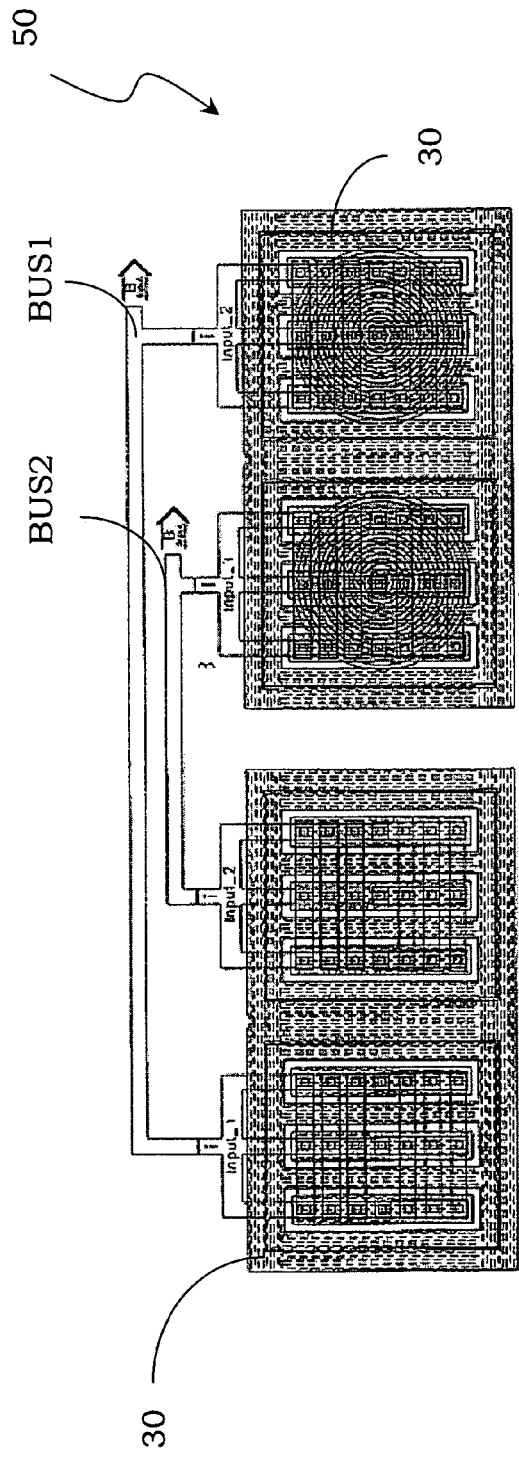
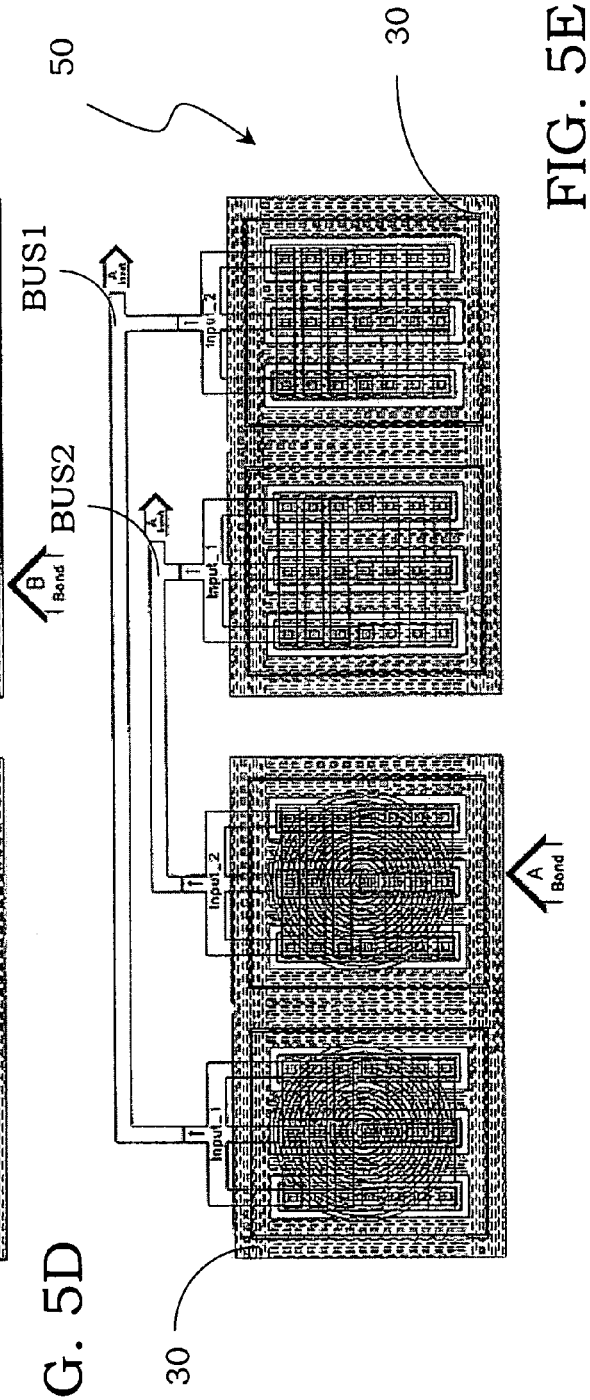
FIG. 5D
FIG. 5E

CONFIGURATION TERMINAL FOR INTEGRATED DEVICES AND METHOD FOR CONFIGURING AN INTEGRATED DEVICE

BACKGROUND OF THE INVENTION

1. Field of the Invention

The present invention relates to a configuration terminal for integrated devices. The invention also relates to a method for configuring an integrated device.

2. Description of the Related Art

As it is well known in the field of semiconductor integrated devices, there is often the need of configuring, in an optional way, devices sharing a fundamental structure.

In particular, such configuration flexibility of the integrated devices occurs each time a single configuration or layout is to be used, and when, in the meantime, what follows is to be considered:

as many functionalities as possible for the devices thus configured;

providing higher capacity for a base device, such as a memory device;

arranging multiple assemblies of integrated devices and in particular of chips on more levels (to obtain the so-called stacked structures);

allowing a single device a greater configuration flexibility (for example to allow an exchange of its contact terminals or pads).

For example, using such a configuration is known in a case having a memory cut off greater than the one technologically possible.

In such case, a plurality of elementary memory devices integrated with the technology available (and thus of smaller dimensions than what desired) is assembled in a stacked structure for realizing a memory of greater dimensions and possible expansions thereof. Such elementary memory devices are thus provided with address pads and additional "configuration" pads. In particular, such additional configuration pads are used for "sensitizing", in combination with the additional address pads, the activation of a single elementary memory device among the ones in the stacked structure.

It is also known that when the expansion is greater than 2 (4, 8 . . . ) more additional configuration pads are to be provided.

The presence of configuration pads conditions the memory device layout since such configuration pads should be placed between the terminals or pins of the voltage references used, in particular the supply voltage reference Vdd and ground Gnd. More specifically, the configuration pads are to be placed in a central position with respect to such supply pins. In this way, for each additional configuration pad also an additional supply pin is to be added, connected to ground Gnd or to the supply voltage reference Vdd, for allowing the correct positioning of the additional configuration pads.

An example of layout of an integrated device provided with additional address and configuration pads is schematically shown in FIG. 1, globally indicated with 10.

The device 10 has a first P1 and a second supply pin P2, as well as an additional supply pin P3. In particular, in the example shown in the figure, the first supply pin P1 is connected to the supply voltage Vdd, the second supply pin P2 is connected to the ground Gnd and the additional supply pin P3 is connected to the supply voltage Vdd.

The device 10 also has n address pads A0 . . . An dedicated to the normal operation of the device itself, as well as a first An+1 and a second An+2 additional address pads connected to corresponding first Bn+1 and second Bn+2 additional configuration pads introduced for realizing an expansion of the device 10. Although in the example of FIG. 1 only two additional configuration and address pads are indicated, it is clear that it is possible to consider any number of such additional pads, according to the configuration needs of the device at issue.

In particular, the first additional configuration pad Bn+1 is used for sensitizing the first additional address pad An+1 on a high level, or equivalently low, to a configuration signal received. It is also possible to associate a different configuration of the device with said high and low values of the configuration signal on the additional configuration pad Bn+1. As shown in the figure, it is possible to place such first additional configuration pad Bn+1 between the supply and ground pins, P1 and P2 respectively, normally present in any integrated device, respecting the central positioning constraints for said configuration pads.

The presence of a second additional configuration pad Bn+2 however causes the addition of the additional supply pin P3 for enabling a correct positioning of such additional configuration pad Bn+2 between the second supply pin P2 and such additional supply pin P3, as shown in FIG. 1.

It is thus obvious that when the number of additional address pads of the integrated device increases a corresponding increase of the number of additional configuration pads is to be provided, which in turn causes the introduction of a congruous number of additional supply pins.

It is immediate to verify that, in the case of a great number of configuration pads, the hypothesis of feasibility becomes problematic and, in addition, its implementation is expensive and penalizing.

In the case of implementations of more functionalities of an integrated device, resorting to Option_Mask solutions is alternatively known for the configuration step of the device itself, which, however, imply a further expense increase due to the cost of the masks and to their management, as well as the introduction of a corresponding additional process step.

In the case of expansions of an integrated device by means of structures of the Stacked type, the traditional approach of connection by means of leads or metallic wires (the so called "Bonding") is also complex, often tied to conditions of feasibility and in any case affected by complications of the bonding operation.

FIG. 2 shows, by way of example, a possible connection by means of bonding of a stacked structure 20. It is clear how the connection of single pads Tn of different levels L1 . . . Ln of the stacked device 20 by using a plurality of connection wires Wn to the common supply pins Pn requires an accurate planning of the positioning of such pads Tn and of the connection wires Wn to avoid that accidental contacts between such wires jeopardize the correct operation of the stacked structure 20 once assembled, although the case considered is the most favorable case in terms of position and number of pads at stake.

The above limitations and complications strongly affect, in the devices realized according to the prior art, both the "extended multi_configurability" and the essential one. It is important to remark that the available configurabilities are not only of the "expansion" or "multi-stacked" type as in the case of memory device but also of the "functional" type. The complexity associated with their implementations in practice limits and/or does not recommend the use thereof.

BRIEF SUMMARY OF THE INVENTION

One embodiment of the present invention provides an integrated device with configuration terminals, having such structural and functional characteristics as to allow to overcome the limits and the drawbacks still affecting the methods realized according to the prior art.

One embodiment of the present invention provides the integrated device with pads able to realize a connection to a supply and a ground voltage reference in an optional way. In particular, such pads are sensitive to short circuit and allow to carry out the configuration of such device at the end of the realization process, not introducing any layout constraint and minimizing the area occupation, favoring in this way the assemblies of the stacked type and the functional options.

The characteristics and advantages of the configuration terminal and of the configuration method according to the invention will be apparent from the following description of an embodiment thereof given by way of indicative and non limiting example with reference to the annexed drawings.

BRIEF DESCRIPTION OF THE SEVERAL VIEWS OF THE DRAWINGS

In such drawings:

FIGS. 3A and 3B schematically show respective top and cross section views of a configuration terminal of an integrated device realized according to one embodiment of the invention;

FIGS. 5A-5E, and from 6 to 8 schematically show possible applications of the configuration terminal according to one embodiment of the invention.

DETAILED DESCRIPTION OF THE INVENTION

Figure 1:
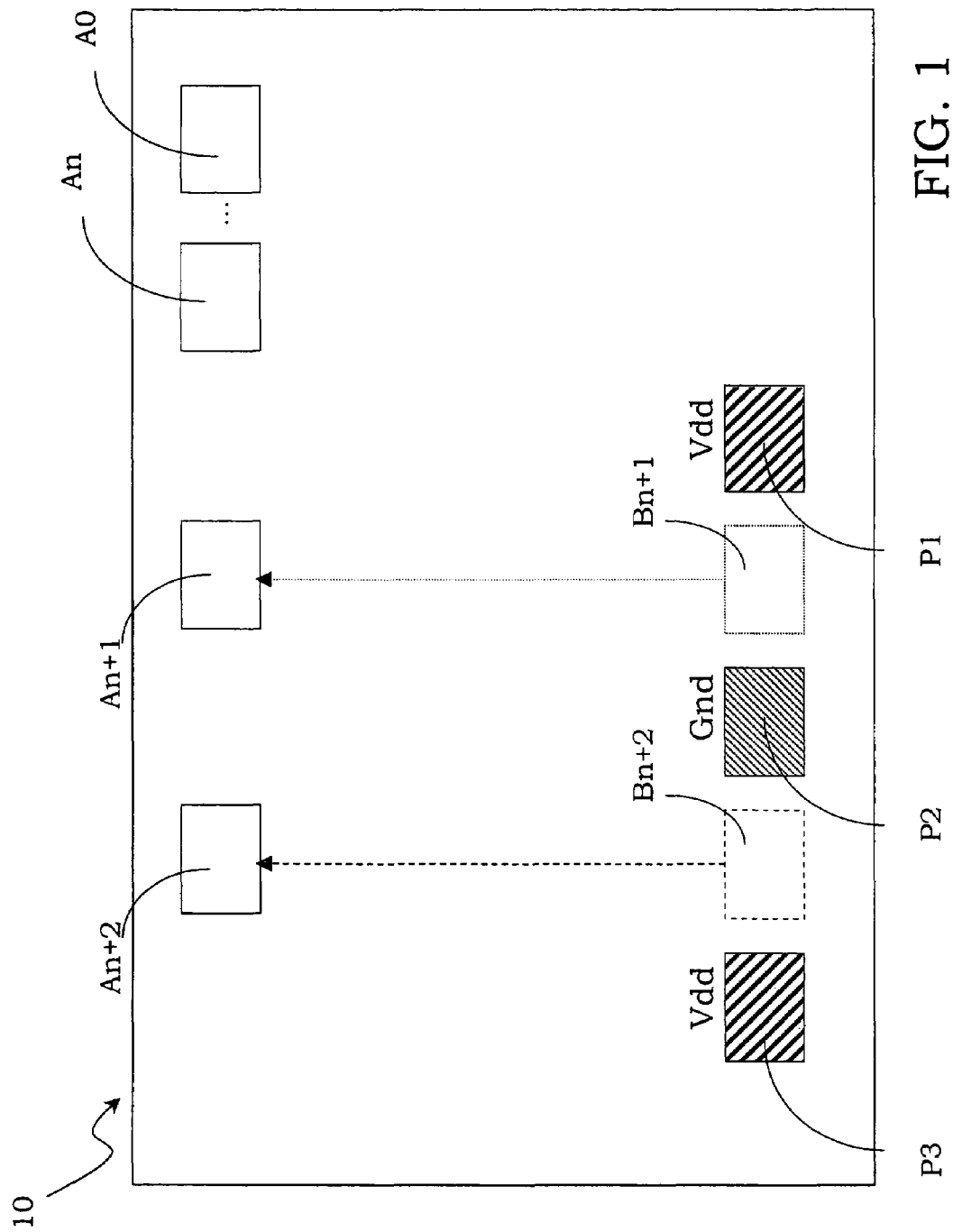
FIG. 1 schematically shows an integrated device comprising address and configuration pads and realized according to the prior art.

With reference to such figures, and in particular to FIGS. 3A and 3B, a configuration terminal for integrated devices realized according to the present invention is globally and schematically indicated at 30.

Advantageously according to the invention, the configuration terminal 30 has a symmetrical structure and is made of a first portion 30a, suitably connected by a first terminal Ta to a first voltage reference, in particular a supply voltage Vdd, as well as of a second portion 30b suitably connected by a second terminal Tb to a second voltage reference, in particular a ground Gnd.

As highlighted in the cross section of FIG. 3B, the first portion 30a of the configuration terminal 30 has a first metallization level, indicated as metal1, connected to the supply voltage Vdd, as well as, by means of a plurality of vias Vm, to a second metallization level, in particular a final metallization level, indicated as metal2.

Advantageously, the second and last metallization level metal2 is suitably interdigitized so as to alternate connected portions 31, which are connected through the vias Vm to the first metallization level metal1, with free portions 32 that are left floating. The interdigitizing is realized by employing minimal distances between the pads of the portions 31, 32 at issue so as to favor the future connection in order to be able to choose the terminal connection to the voltage references (Vdd or Gnd) at the end of the manufacturing process, as it will be clarified hereafter in the description.

In other words, the first and the second portion, 30a and 30b, of the configuration terminal 30 are divided in corresponding central parts 33a, 33b and peripheral parts 34a, 34b. In particular, the central parts 33a, 33b comprise vertical elements 35a, 35b connected to the corresponding terminal, Ta and Tb, and the central parts are completely contained inside the peripheral parts. Advantageously, the peripheral parts 34a, 34b of the portions 30a and 30b are, actually, portions of a contact terminal IN of the configuration terminal 30, such peripheral parts thus being short-circuited with one another.

The contact terminal IN also comprises a central part 36 shared by the peripheral parts 34a, 34b of the two portions 30a and 30b.

It is to be remarked that the central parts 33A, 33B of the portions 30a and 30b of the configuration terminal 30 include portions 32 of the first metallization layer metal1 which are not connected to one another and, especially, they are not connected to the contact terminal IN.

In this way, such free portions 32 of the central parts 33A, 33B of the portions 30a and 30b are structurally independent and physically separated and they can be connected separately to different voltage references, or more in general, to different signals.

In FIG. 3B, the contact to the contact terminal IN by the portions 30a and 30b is made by the free portions 32 and has been indicated by means of arrows with the wording "floating", such floating condition corresponding to an initial condition of the configuration terminal 30 prior to its configuration.

In a preferred embodiment of the invention, such vias Vm are realized by means of metallic plugs, in particular realized with tungsten.

The second portion 30b of the configuration terminal 30 has a structure being similar to the first portion 30a, with connection of the first metallization level metal1 to ground Gnd.

In substance, the configuration terminal 30 has two portions 30a and 30b structurally independent and connected to respective voltage references Vdd and Gnd.

In this way, the configuration terminal 30 realizes a terminal for optional connection to the supply Vdd and ground Gnd voltage references, such connection being realized by simply connecting the contact terminal IN to the central parts of the portions 30a and 30b respectively, thus realizing a local connection to the supply references.

Moreover, given the reduced dimensions of the central parts 33a, 33b of the portions 30a, 30b of the configuration terminal 30, the connection to the contact terminal IN can be realized by means of a "ball" suitable to short-circuit the same realizing local connection areas 38, without having to resort to a real bonding by means of leads or connection wires.

Advantageously, the interdigitizing of the final metallization level, in the example of FIG. 3B the second metallization level metal2, is suitably chosen so as to facilitate the ball operation, minimizing the intervention, and to reduce the amount of material necessary for realizing the short circuit of the corresponding portion of the configuration terminal 30.

It is also possible to realize such local connection areas by means of a real local bonding with leads. It is important to remark the fact that the short circuit realized by the ball or bonding operations is exclusive for the two portions of the configuration terminal 30, the contact having the possibility of occurring with the first portion 30a or with the second portion 30b, never with both in the embodiment of FIGS.

3A-3B. As a result, the ball/local connection area 38 is shown with a dashed line in FIG. 3B. The simultaneity of the balls should be realized only in non-binding pre-configuration contexts of the two portions 30a and 30b when the terminals Ta and Tb are not connected to the supply references, realizing an optional continuity between pads, as better described hereafter.

Figure 3C:
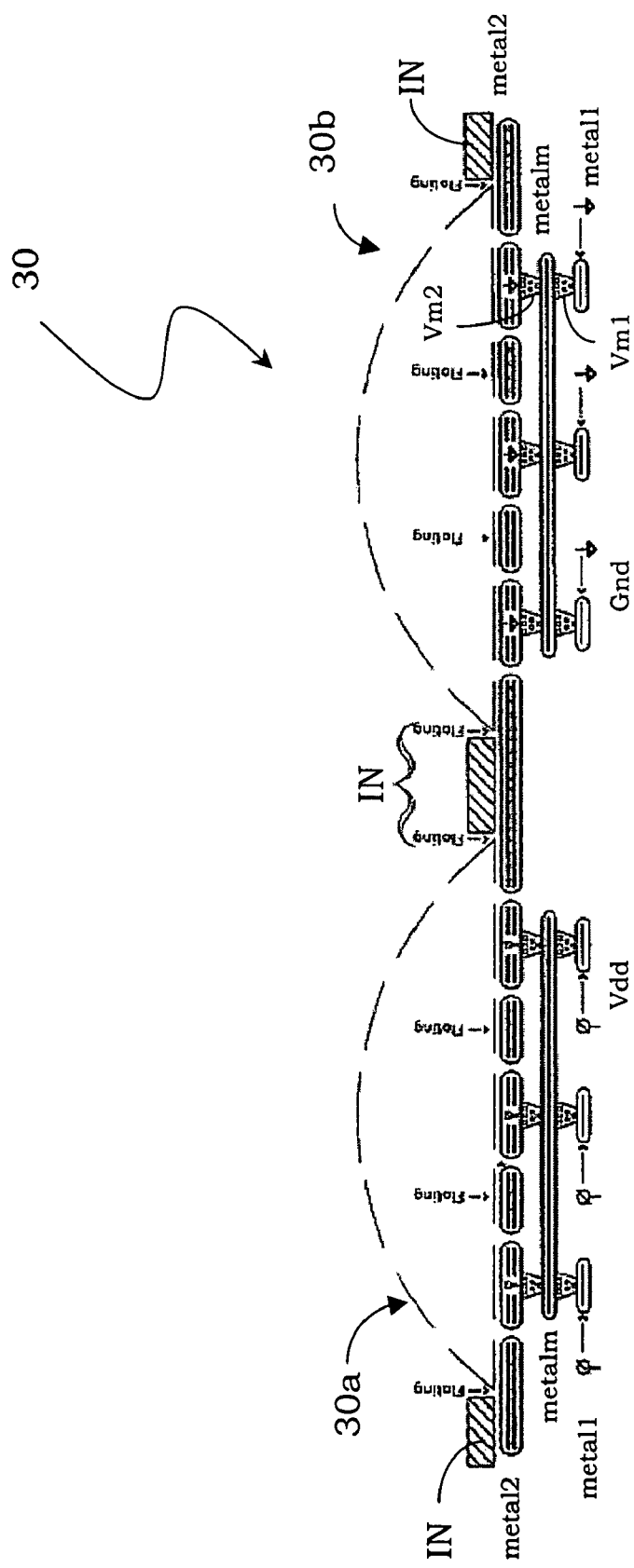
FIG. 3C schematically shows a further embodiment of the configuration terminal of FIG. 3B.

In a preferred embodiment of the configuration terminal 30 according to the invention, one or more intermediate metallization levels are provided, interposed between the first metal1 and the second metallization level metal2, as schematically shown in FIG. 3C. By way of illustration, such figure shows the case of a single intermediate metallization level metalm.

In this case, the first metallization level metal1, connected to the supply reference Vdd in correspondence with the first portion 30a and to the ground Gnd in correspondence with the second portion 30b, is connected to the intermediate metallization level metalm by means of a plurality of first vias Vm1.

Similarly the intermediate metallization level metalm is connected to the second metallization level metal2 by means of a plurality of second vias Vm2.

In the example shown in FIG. 3C, such intermediate metallization level metalm is shown as continuous since the circuit section shown in the figure has been taken in correspondence with a transversal element of such intermediate metallization level metalm. In any case, such intermediate metallization level metalm should have central points connected to each other and to a corresponding terminal, Ta or Tb, of the portions 30a and 30b of the configuration terminal 30. In the case wherein such intermediate metallization level metalm is continuous there is the connection of all the islands 31 of one of the portions 30a, 30b of the configuration terminal 30.

Although the description of the configuration terminal 30 is made with reference to FIGS. 3A-3C, such figures show only possible embodiments of the configuration terminal 30 according to the invention, and the invention is not to be intended as limited thereto.

In particular, it is possible to realize the configuration terminal 30 with structures comprising any number of metallization levels greater than two. In this case, the last metallization level is suitably interdigitized for allowing the connection options for the contact terminal IN of the configuration terminal 30. Moreover, such last level is connected, by means of a plurality of vias, to the underlying levels, at least one of which is suitably connected to the supply references. In particular, without particularly deep connections, it is possible to realize the configuration terminal 30 with a multilevel structure wherein the last metallization level is suitably interdigitized and the next to last is connected to the supply references.

In a preferred embodiment of the invention, such first and second vias are realized by means of metal plugs, in particular realized with tungsten.

Figure 4:
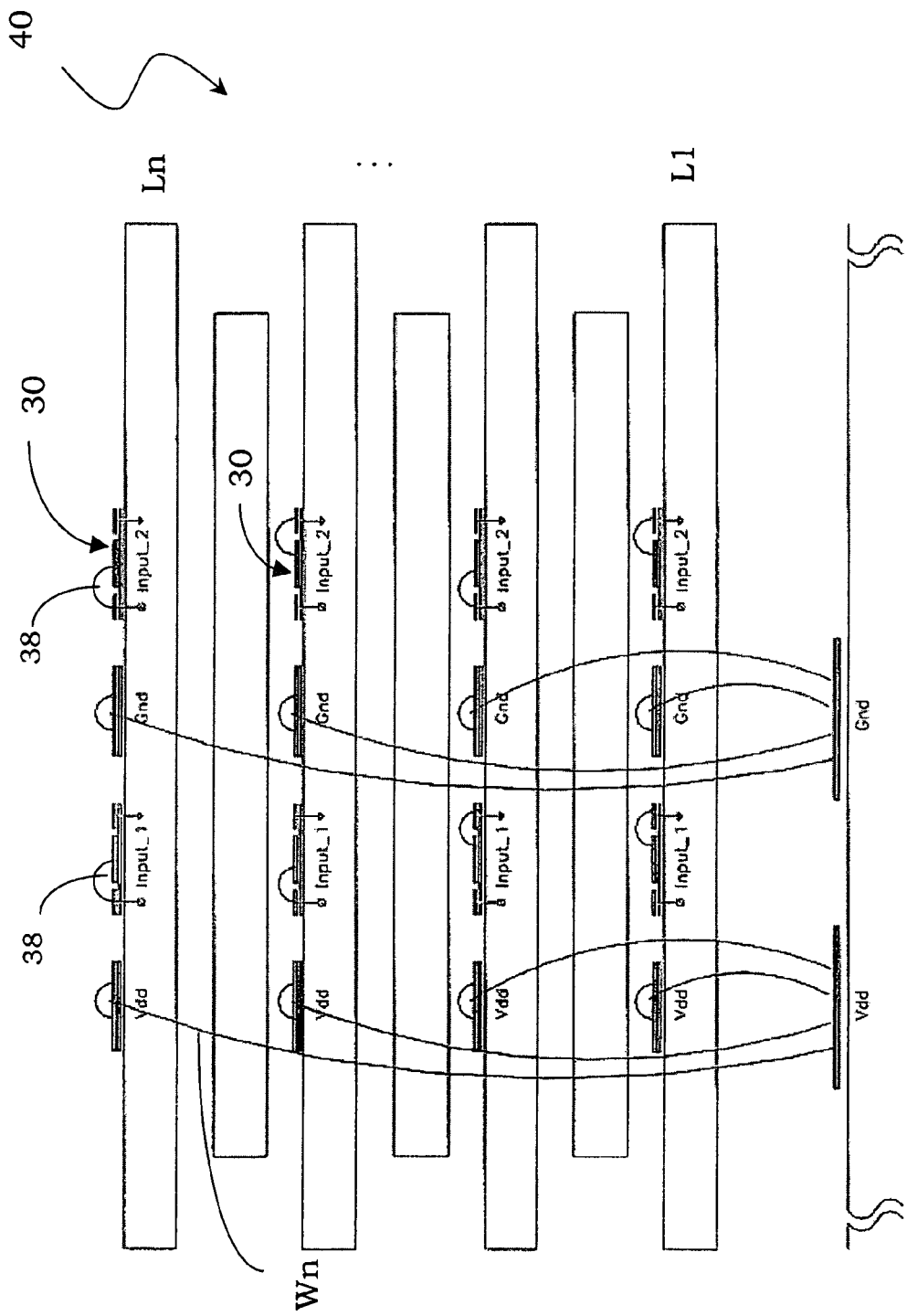
FIG. 4 schematically shows a stacked structure of integrated devices realized according to one embodiment of the invention.

Thanks to the use of such configuration terminals, it is possible to realize a stacked structure of integrated devices having a simplified layout, schematically shown in FIG. 4 and globally indicated with 40. It is to be remarked that, advantageously according to the invention, the single integrated devices do not need dedicated supplies besides the normal supply and they can comprise any number of configurable pins which can be placed anywhere, without the need of closeness to a supply reference.

The stacked structure 40 shown in FIG. 4 comprises a plurality of devices or levels L1 . . . Ln, each one comprising at least one configuration terminal 30 realized according to the invention besides the traditional supply pads connected to the pins of the voltage references Gnd and Vdd.

Advantageously the stacked structure 40 has a limited number of leads or connection wires Wn, limiting the risk of short circuit being the selective options introduced only by means of bond.

In particular, the configuration terminal 30 has local connection areas 38 for the connection to the voltage references Vdd and Gnd and they do not need local connection wires in addition to the supply connection wires Wn that provide the usual connection of the supply pads of the single levels. Therefore the integrated devices comprised in the stacked structure 40 are maintained at the minimal number of pins (minimal pinout). In fact, as shown in FIG. 4, only two supply pins are enough.

In this way, carrying out, in the assembly step, the so called ball is enough for realizing the local connection areas 38 for "fixing" the connection of the configuration terminal 30 to one of the voltage references, Vdd or Gnd. The configuration terminals 30 are thus configurable by means of short circuit. Hereafter in the description "terminals being sensitive to the short circuit" will be used for indicating such possibility of configuration by means of a simple short circuit.

Moreover, being able to reduce the number of bonding connections or leads of the supply pins, it is possible to reduce the distance between such pins with respect to the configurations used for the traditional devices since the risk of short circuit between fewer bonding wires is lower. The reduced short circuit risk between different leads allows to contain the realizing spaces of the configuration terminal 30 (already minimized in their execution) being able to reduce the distance between the same and the pads provided with leads For each additional configuration address of the integrated device, it is in fact enough to introduce a configuration terminal 30, for realizing the corresponding configuration terminal with the desired connection to the voltage references, Vdd and Gnd.

Figure 2:
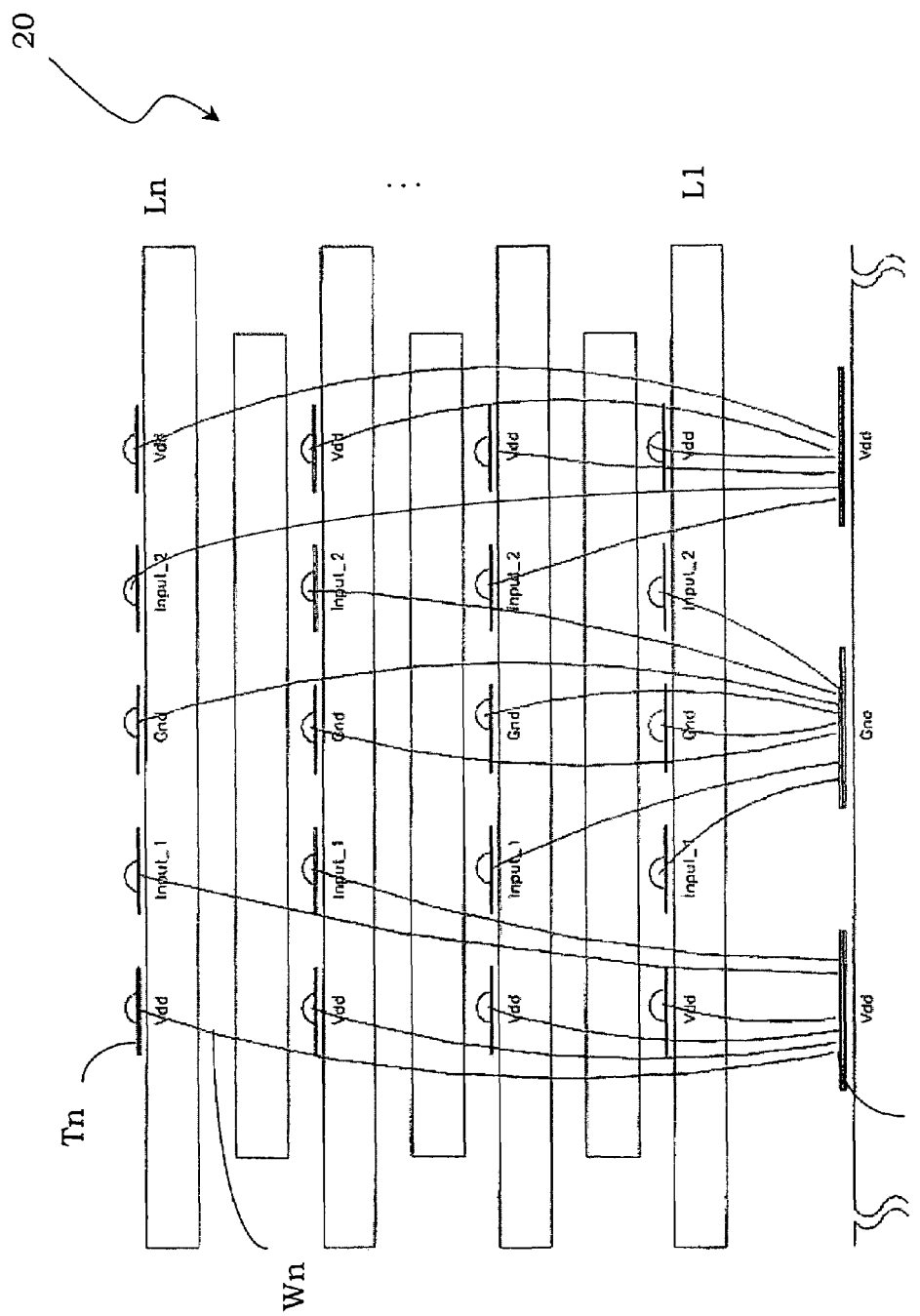
FIG. 2 schematically shows a stacked structure of integrated devices realized according to the prior art.

A comparison with the stacked structure 20 realized according to the prior art and shown in FIG. 2 allows one to immediately appreciate the layout and bonding simplification of the stacked structure 40. One could also appreciate the further advantage linked to the freedom of positioning the configuration terminals 30. However, to facilitate the comparison with the known solution, an identical scheme has been respected for the positioning of the configuration terminals 30 in FIG. 4. It is also to be highlighted that the stacked structure 40 compared to the stacked structure 20 realized according to the prior art does not require more than two supply pins (in particular supply Vdd and ground Gnd).

Moreover, the configuration terminals 30 do not introduce layout constrains since they do not need a particular positioning with respect to the supply reference pins.

It is also to be noted that the presence of the portions 30a and 30b and of the local connection areas 38 in the configuration terminal 30 implies an increase of its dimensions with respect to a traditional pad, to avoid any risk of short circuit of the terminal, without however reaching the dimensions of two traditional pads, such area increase being however moderate if compared with the several advantages attained in terms of layout of the device.

The configuration terminal 30 allows to obtain the following advantages:
  in the first place, the portions 30a and 30b of the configuration terminal 30 can be moved closer together to attain a reduction of the dimension of the terminal itself;
  in the second place, given the reduced dimensions of the central parts of the configuration terminal 30 portions, the connection 38 to the contact terminal IN can be simply realized by means of a "ball" operation;

in the third place, the configuration terminal 30 allows to bring in place the desired supply references, independently from the number of the device pins;

finally, the configuration terminal 30 allows to eliminate any constrain with the outside, thanks to independent portions realized by central parts completely insulated from peripheral parts, thus having the possibility of being placed freely inside an integrated device.

Thanks to the use of such configuration terminals being sensitive to the short circuit it is possible to configure an integrated device at the end of the realization process of the same.

In particular, the configuration method according to one embodiment of the invention comprises the steps of:

providing an integrated device comprising a plurality of configuration terminals;

realizing the configuration terminals by means of a first portion connected to a first supply reference and a second portion connected to the ground Gnd and configurable by means of the short circuit;

configuring the device at the end of its realization process by means of a short-circuiting step of such configuration terminals.

Although integrated devices comprising a plurality of additional address and configuration terminals have been dealt with, it is also possible to apply the invention also to devices comprising a single additional address and configuration terminal.

Advantageously, as already previously hinted at, the configuration terminal 30 can be used also for realizing further functions useful for an integrated device. In such applications, the terminals Ta and Tb of the inner parts of the portions 30A and 30B are not connected to any supply reference (Vdd and Gnd).

First of all, making reference in particular to FIGS. 5A to 5E, it is possible to realize a configuration structure 50 comprising a pair of configuration terminals 30 for carrying out an exchange between two input signals A and B on a first BUS1 and a second line BUS2.

In particular, the configuration terminals 30 of such pair have first input_1 and second contact terminals input_2 connected to each other in a crossed way and connected to the first BUS1 and to the second line BUS2.

In particular, making reference to the section shown in FIG. 3C, the first metallization level metal1 is, in this case, left floating (not connecting the terminals Ta and Tb) while the intermediate metallization level metalm of the first 30a and second portions 30b is connected to the input signals A and B, respectively.

Figures 5A, 6, 7:
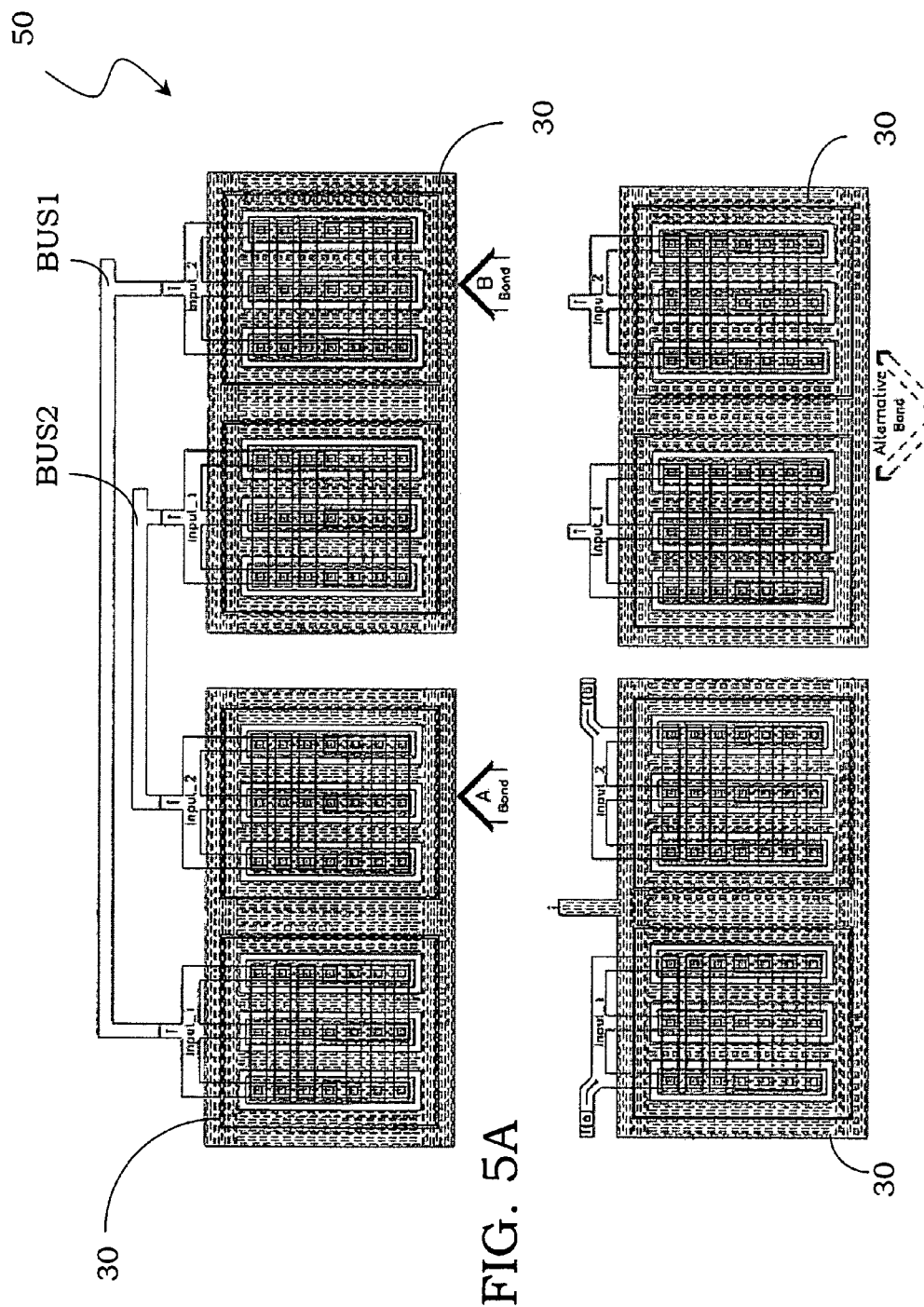
Figures 5B, 5C:
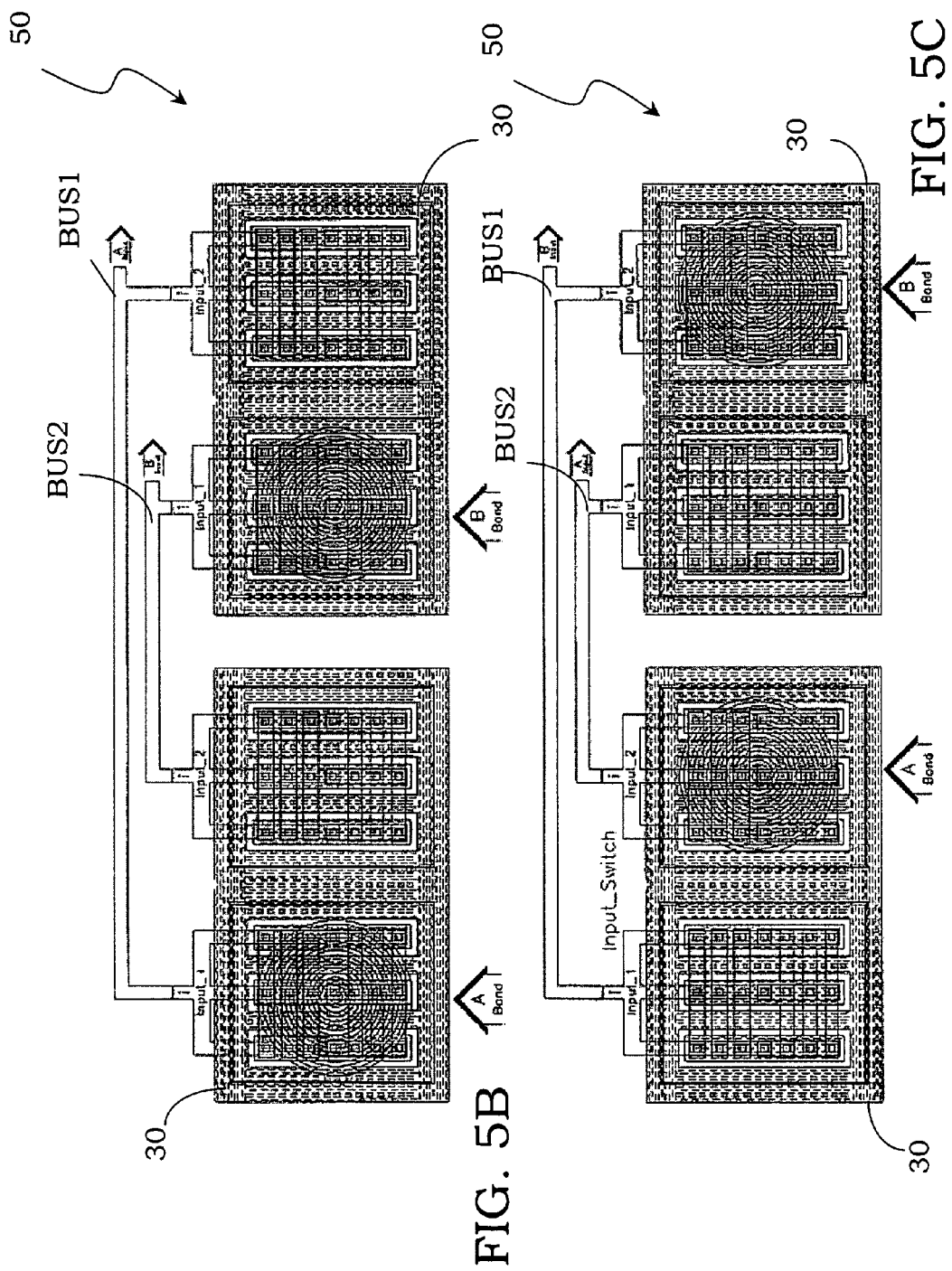

Advantageously, by means of a bonding connection it is thus possible to apply such input signals A and B to the first and to the second line BUS1 and BUS2, respectively, and to exchange them with each other, by simply inverting the bonding carried out on the portions 30a and 30b of the pair of configuration terminals 30, as shown in FIGS. 5B and 5C.

It is also possible to connect both the lines BUS1 and BUS2 to an input signal, A or B, as schematically shown in FIGS. 5D and 5E. In this case, both the portions 30a and 30b of a configuration terminal 30 of the pair are connected by means of bonding to the input signal of interest, A or B.

It is to be noted that in the traditional devices such inversion or however a change of the paths for signals coming from outside implies a change of the device used.

It is also possible to change the functionality of a configuration terminal 30, as schematically shown in FIG. 6.

In particular, the portions 30a and 30b of the configuration terminal 30 are in this case connected to a first f(a) and to a second function f(b) (for example, counter for 64 or for 128) and, by means of short circuit of the portion connected to the function of interest with the contact terminal IN, the configuration terminal 30 is configured so as to operate according to one of such functions.

In this case, making reference to the section shown in FIG. 3C, the first metallization level metal1 of the two portions 30a and 30b is kept floating (not connecting the terminals Ta and Tb) and the second metallization level metal2 is used for realizing the desired functions f(a) and f(b).

In this case, the configuration step of the device by means of a ball operation (or equivalently a bonding one) allows to change the functionality of the device itself (in the example considered from counter for 64 to counter for 128, or vice versa).

Once again it is to be noted that the terminal configuration is decided freely at the end of the manufacturing process by means of short circuit and the corresponding integrated device internal signal can be treated without the use of additional masks and with a wide flexibility.

Always by using the separation of the portions 30a and 30b of the configuration terminal 30 according to the invention it is possible to realize the exchange of connections of the reversible type: external-internal and internal-external, as schematically shown in FIG. 7.

In this case, the portions 30a and 30b are connected to respective contact terminals Input_1 and Input_2 and, by means of bonding by leads, the one or the other of such terminals is enabled to be visible outside.

Figure 8:
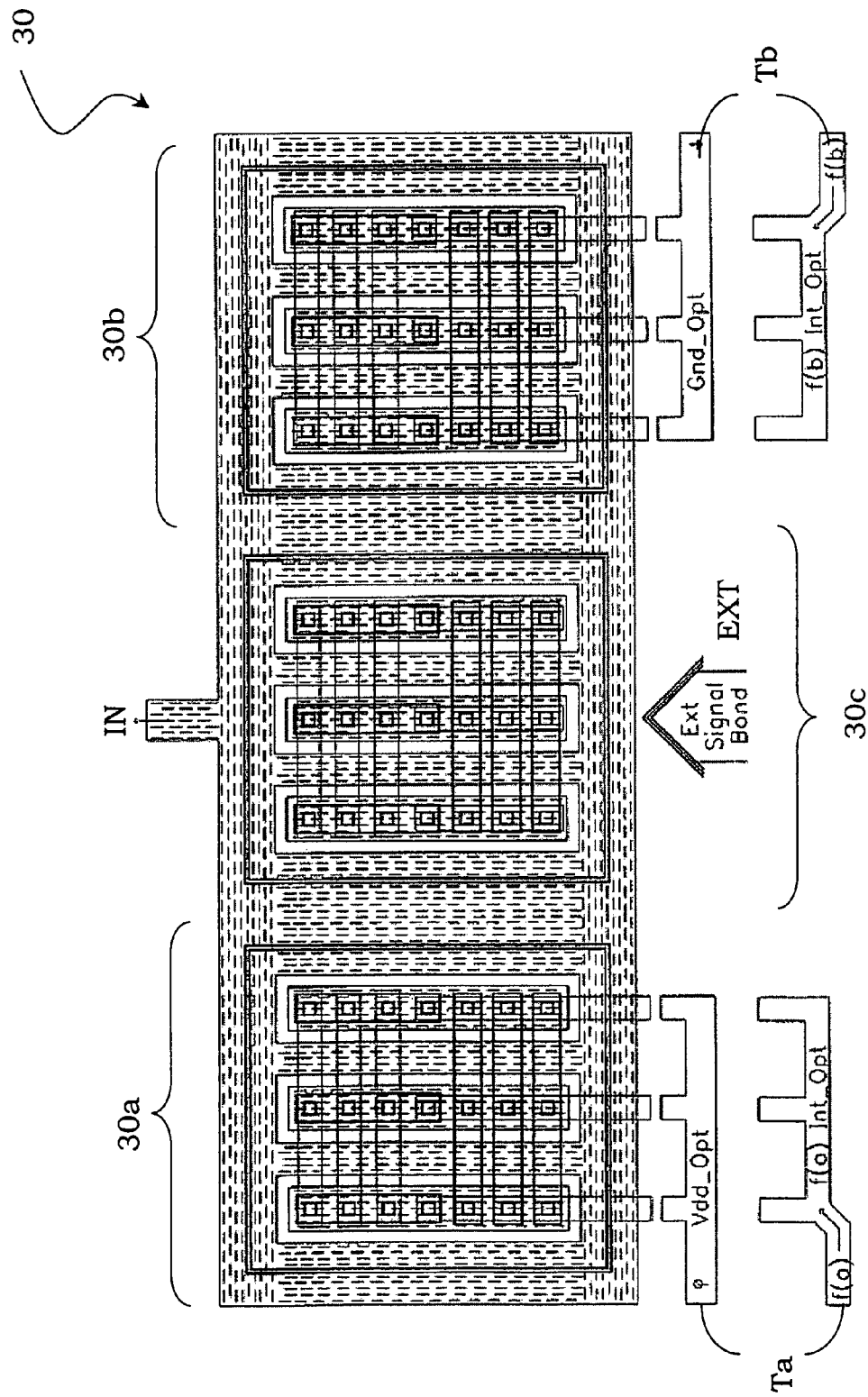

In an even more general way, as schematically shown in FIG. 8, the configuration terminal 30 has a first 30a, a second 30b and a third portion 30c, structurally independent from one another.

As previously seen, the first 30a and the second portion 30b have respective terminals Ta and Tb. The third portion 30c, which is intermediate between such first and second portions 30a and 30b, is connected between an external reference EXT and the contact terminal IN of the configuration terminal 30.

In this way, if the terminals Ta and Tb are left floating, the configuration terminal 30 transmits the external reference EXT to the contact reference IN.

If instead a short circuit is carried out of one of such portions, the corresponding signal thereon is transmitted to the contact terminal IN.

It is also possible, in this case, to consider the terminals Ta and Tb of the first 30a and of the second portions 30b connected to the supply references Vdd and Gnd or receiving suitable functions f(a) and f(b), as shown in the figure.

It is also possible to invert the origin of the signal from the inside towards the outside with non forcing leads, as well as to deviate the signal on the input f(a) and/or f(b) in turn internal, the direction of the flows of signals realized by the configuration terminal 30 shown in FIG. 8 being completely free.

In other words, the configuration terminal 30 is able to realize connections of the internal-external, external-internal, internal-internal type.

Advantageously, the final choice of the signal on the contact terminal IN of the shown configuration terminal 30 can be left free during the realization step of the integrated device comprising such terminal and defined only in a successive design step by means of simple short circuiting one of the portions composing the configuration terminal 30.

In conclusion, the proposed configuration terminal 30 allows to obtain integrated devices with high configurability and in the meantime:

to operate a simplification of the bonding;

to consider more configuration inputs on a same chip;

to remove the configurability constrains concerning the closeness of the supply references;

to minimize the area occupation;

to favor the assemblies of the stacked type.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A configuration terminal for integrated devices, comprising
    a first conductive portion and a second conductive portion;
    first and second terminals electrically connected to the first and second conductive portions, respectively; and
    a contact terminal suitable to be selectively connected to said first and second terminals, the contact terminal including:
    a conductive central portion;
    a conductive, unitary first peripheral portion spaced apart from and completely laterally surrounding the first conductive portion; and
    a conductive, unitary second peripheral portion spaced apart from and completely laterally surrounding the second conductive portion, the first and second peripheral portions being in contact with the central portion.

2. The configuration terminal according to claim 1, further comprising a local connection area suitable to short circuit said contact terminal with one of said first and second conductive portions.

3. The configuration terminal according to claim 2, wherein said local connection area includes a conductive ball connecting the contact terminal and the one of said first and second conductive portions.

4. The configuration terminal according to claim 2, wherein said local connection area includes a bonded connection.

5. The configuration terminal according to claim 1, wherein said first and second terminals are connected to respective supply references.

6. The configuration terminal according to claim 1, wherein said first and second terminals are connected to respective input signals.

7. The configuration terminal according to claim 1, wherein said first and second terminals are connected to respective input functions.

8. The configuration terminal according to claim 1, wherein each conductive portion comprises:
    a non-final metallization level connected to the respective terminal of the first and second terminals;
    a final metallization level completely laterally surrounded by the respective one of the peripheral portions; and
    a first plurality of vias connecting the non-final metallization level to the final metallization level.

9. The configuration terminal according to claim 8, wherein said final metallization level includes first sub-portions connected to said non-final metallization level and the contact terminal includes second sub-portions which are not connected to said non-final metallization level, are interdigitized with the first sub-portions, and extend between opposite sides of the respective one of the peripheral portions.

10. The configuration terminal according to claim 9, wherein said interdigitizing of said final metallization level is suitably chosen so as to facilitate a short-circuiting operation of said level.

11. The configuration terminal according to claim 8, further comprising an intermediate metallization level interposed between said non-final metallization level and said final metallization level and connected to the final metallization level by a second plurality of vias.

12. The configuration terminal according to claim 11, wherein said non-final metallization levels of the first and second conductive portions are connected to respective supply references.

13. The configuration terminal according to claim 8 wherein said vias comprise metallic plugs.

14. The configuration terminal according to claim 1, further comprising a third conductive portion interposed between said first and second conductive portions, said contact terminal including a conductive, unitary third peripheral portion spaced apart from and completely laterally surrounding the third conductive portion, the third peripheral portions being in contact with the central portion.

15. The configuration terminal according to claim 14, wherein said third conductive portion is connected to an external reference signal that is transmitted to said contact terminal when the first and second terminals are floating.

16. The configuration terminal according to claim 15, wherein the first and second conductive portions are connected to external and internal structures, respectively.

17. The configuration terminal according to claim 14, further comprising a local connection area suitable to short-circuit said third conductive portion with at least one of said first and second conductive portions.

18. A semiconductor-integrated device, comprising:
    a plurality of address pads;
    a plurality of supply pins; and
    a configuration terminal that includes:
        a first conductive portion and a second conductive portion;
        first and second terminals electrically connected to the first and second conductive portions, respectively; and
        a contact terminal suitable to be selectively connected to said first and second terminals, the contact terminal including:
        a conductive central portion;
        a conductive, unitary first peripheral portion spaced apart from and completely laterally surrounding the first conductive portion; and
        a conductive, unitary second peripheral portion spaced apart from and completely laterally surrounding the second conductive portion, the first and second peripheral portions being in contact with the central portion.

19. The semiconductor-integrated device of claim 18, further comprising a conductive ball connecting the contact terminal and one of said first and second conductive portions.

20. The semiconductor-integrated device of claim 18, wherein each conductive portion comprises:
    a non-final metallization level connected to the respective terminal of said first and second terminals;
    a final metallization level completely laterally surrounded by the respective one of the peripheral portions; and
    a first plurality of vias connecting the non-final metallization level to the final metallization level.

21. The semiconductor-integrated device of claim 20, wherein said final metallization level includes first portions connected to said non-final metallization level and the contact terminal includes second portions which are not connected to said non-final metallization level, are interdigitized with the first portions, and extend between opposite sides of the respective one of the peripheral portions.

22. The semiconductor-integrated device of claim 20, wherein each conductive portion comprises an intermediate metallization level interposed between said non-final metallization level and said final metallization level and connected to the final metallization level by a second plurality of vias.

23. The semiconductor-integrated device of claim 18, wherein the configuration terminal includes a third conductive portion interposed between said first and second conductive portions, said contact terminal including a conductive, unitary third peripheral portion spaced apart from and completely laterally surrounding the third conductive portion, the third peripheral portions being in contact with the central portion.

24. A stacked structure, comprising:
   a plurality of devices arranged on a plurality of levels, each of said devices having a configuration terminal that includes:
      a first conductive portion and a second conductive portion;
      first and second terminals electrically connected to the first and second conductive portions, respectively; and
      a contact terminal suitable to be selectively connected to said first and second conductive terminals, the contact terminal including:
         a conductive central portion;
         a conductive, unitary first peripheral portion spaced apart from and completely laterally surrounding the first conductive portion; and
         a conductive, unitary second peripheral portion spaced apart from and completely laterally surrounding the second conductive portion, the first and second peripheral portions being in contact with the central portion.

25. The stacked structure of claim 24, wherein each configuration terminal includes a conductive ball connecting the contact terminal and one of said first and second conductive portions.

26. The stacked structure of claim 24, wherein each conductive portion comprises:
   a non-final metallization level connected to the respective terminal of the first and second terminals;
   a final metallization level completely laterally surrounded by the respective one of the peripheral portions; and
   a first plurality of vias connecting the non-final metallization level to the final metallization level.

27. The stacked structure of claim 26, wherein said final metallization level includes first portions connected to said non-final metallization level second portions which are not connected to said non-final metallization level, are interdigitized with the first portions, and extend between opposite sides of the respective one of the peripheral portions.

28. The stacked structure of claim 26, wherein each conductive portion comprises an intermediate metallization level interposed between said non-final metallization level and said final metallization level and connected to the final metallization by a second plurality of vias.

29. The stacked structure of claim 24, wherein the configuration terminal includes a third portion interposed between said first and second conductive portions, said contact terminal including a conductive, unitary third peripheral portion spaced apart from and completely laterally surrounding the third conductive portion, the third peripheral portions being in contact with the central portion.

30. The semiconductor-integrated device of claim 18, comprising a stacked structure that includes:
   a plurality of devices arranged on a plurality of levels, wherein the configuration terminal is one of a plurality of configuration terminals of the devices, respectively, each of said configuration terminals including:
      a first conductive portion and a second conductive portion
      first and second terminals; and
      a contact terminal suitable to be selectively connected to said first and second terminals, the contact terminal including:
         a conductive central portion;
         a conductive, unitary first peripheral portion spaced apart from and completely laterally surrounding the first conductive portion; and
         a conductive, unitary second peripheral portion spaced apart from and completely laterally surrounding the second conductive portion, the first and second peripheral portions being in contact with the central portion.

* * * * *

UNITED STATES PATENT AND TRADEMARK OFFICE
CERTIFICATE OF CORRECTION

| | | |
|---|---|---|
| PATENT NO. | : 7,501,705 B2 | Page 1 of 1 |
| APPLICATION NO. | : 11/261457 | |
| DATED | : March 10, 2009 | |
| INVENTOR(S) | : Luigi Pascucci | |

It is certified that error appears in the above-identified patent and that said Letters Patent is hereby corrected as shown below:

Column 9
Claim 1, Lines 19-20, "A configuration terminal for integrated devices, comprising" should read as, --A configuration terminal for integrated devices, comprising:--.

Column 10
Claim 14, Lines 23-24, "portion spaced apart from and completely laterally surrounding the third conductive portion, the third peripheral portions" should read as, --portion spaced apart from and completely laterally surrounding the third conductive portion, the third peripheral portion--.

Column 11
Claim 23, Line 19, "third peripheral portions being in contact with the central" should read as, --third peripheral portion being in contact with the central--.

Column 12
Claim 27, Line 9, "non-final metallization level second portions which are not" should read as, --non-final metallization level, second portions which are not--.

Claim 29, Lines 18-19, "The stacked structure of claim 24 wherein the configuration terminal includes a third portion interposed between" should read as, --The stacked structure of claim 24 wherein the configuration terminal includes a third conductive portion interposed between--.

Claim 29, Line 23, "third conductive portion, the third peripheral portions being" should read as, --third conductive portion, the third peripheral portion being--.

Signed and Sealed this
First Day of February, 2011

David J. Kappos
*Director of the United States Patent and Trademark Office*